United States Patent
de Figueiredo et al.

(10) Patent No.: US 10,038,454 B2
(45) Date of Patent: Jul. 31, 2018

(54) REFERENCE VOLTAGE GENERATOR FOR AN ANALOG-DIGITAL CONVERTER AND METHOD FOR ANALOG-DIGITAL CONVERSION

(71) Applicant: Synopsys, Inc., Mountain View, CA (US)

(72) Inventors: Pedro Miguel Ferreira de Figueiredo, São Domingos de Rana (PT); Paulo António Ribeiro Cardoso, Árvore (PT)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/307,793

(22) PCT Filed: Apr. 29, 2014

(86) PCT No.: PCT/US2014/035966
§ 371 (c)(1),
(2) Date: Oct. 28, 2016

(87) PCT Pub. No.: WO2015/167478
PCT Pub. Date: Nov. 5, 2015

(65) Prior Publication Data
US 2017/0047940 A1  Feb. 16, 2017

(51) Int. Cl.
*H03M 1/38* (2006.01)
*H03M 1/46* (2006.01)
(Continued)

(52) U.S. Cl.
CPC ........... *H03M 1/38* (2013.01); *H03M 1/0617* (2013.01); *H03M 1/1245* (2013.01); *H03M 1/468* (2013.01)

(58) Field of Classification Search
CPC .... H03M 1/38; H03M 1/1245; H03M 1/0617; H03M 1/468
(Continued)

(56) References Cited

U.S. PATENT DOCUMENTS 6,473,021 B1    10/2002    Somayajula et al.
8,552,897 B1 *  10/2013    Hurrell ..................... H03F 3/45
                                                      341/136
(Continued)

OTHER PUBLICATIONS

PCT International Search Report and Written Opinion, PCT Application No. PCT/US2014/035966, dated Jan. 19, 2015, 12 pages.
(Continued)

*Primary Examiner* — Brian Young
(74) *Attorney, Agent, or Firm* — Fenwick & West LLP (57) ABSTRACT

Analog-digital converter configured for conversion of an input voltage, represented by a pair of input potentials, into a binary code using successive approximation. The analog-digital converter comprises a reference voltage generator (RVG) supplying a first pair of reference potentials and a second pair of reference potentials. The analog-digital converter further comprises a switched capacitor array (SCA) configured to receive the first and the second pair of reference potentials as well as a control unit (CTRL) coupled to the switched capacitor array (SCA) and configured to switch capacitors of the switched capacitor array (SCA) either to the first pair of reference potentials or to the second pair of reference potentials depending on a progress of the conversion.

33 Claims, 5 Drawing Sheets

(51) Int. Cl.
*H03M 1/06* (2006.01)
*H03M 1/12* (2006.01)

(58) Field of Classification Search
USPC .................................................. 341/155, 161
See application file for complete search history.

(56) References Cited

U.S. PATENT DOCUMENTS

| | | | | |
|---|---|---|---|---|
| 9,608,656 | B2* | 3/2017 | Yuan | H03M 1/1245 |
| 9,614,539 | B2* | 4/2017 | Tang | H03M 1/466 |
| 9,641,189 | B2* | 5/2017 | Maddox | H03M 1/1071 |
| 2011/0260899 | A1 | 10/2011 | Snedeker | |
| 2013/0249727 | A1 | 9/2013 | Hurrell | |

OTHER PUBLICATIONS

Cao, Z. et al., "A 32 mW 1.25 GS/s 6b 2b/Step SAR ADC in 0.13μm CMOS," IEEE Journal of Solid-State Circuits, Mar. 2009, pp. 862-873, vol. 44, No. 3.

Kapusta, R. et al., "A 14b 80 MS/s SAR ADC With 73.6 dB SNDR in 65 nm CMOS," IEEE Journal of Solid-State Circuits, Dec. 2013, pp. 3059-3066, vol. 48, No. 12.

Kuttner, F., "A 1.2V 10b 20MSample/s Non-Binary Successive Approximation ADC in 0.13μm CMOS," ISSCC 2002, Session 10, High-Speed ADCs, 10.6, 2002 IEEE International Solid-State Circuits Conference, IEEE, 2002, 2 pages.

Miller, G. et al., "TPM 10.6: An 18b 1 Oμs Self-Calibrating ADC," Session 10: Analog-to-Digital Converters, ISSCC 90, Feb. 15, 1990, 1990 IEEE International Solid-State Circuits Conference, IEEE, pp. 168-169, 292.

Stepanovic, D. et al., "A 2.8 GS/s 44.6 mW Time-Interleaved ADC Achieving 50.9 dB SNDR and 3 dB Effective Resolution Bandwidth of 1.5 GHz in 65 nm CMOS," IEEE Journal of Solid-State Circuits, Apr. 2013, pp. 971-982, vol. 48, No. 4.

* cited by examiner

REFERENCE VOLTAGE GENERATOR FOR AN ANALOG-DIGITAL CONVERTER AND METHOD FOR ANALOG-DIGITAL CONVERSION

FIELD

The disclosure relates to a reference voltage generator to be used in an analog-digital converter working with successive approximation, to an analog-digital converter working with successive approximation and to a method for analog-digital conversion according to the technique of successive approximation.

BACKGROUND

Analog-digital converters, ADCs, translate an analog input signal into the digital domain, according to the full-scale input range defined by a reference voltage. The generation of the reference voltage is critical since any error directly affects the ADC's digital output code. Furthermore, typically the reference voltage is disturbed by the ADC itself, and must settle in a very short amount of time.

Reference voltage generators in common ADCs often have the disadvantages of dissipating a significant amount of power (comparable or higher than the consumption of the actual ADC), imposing limits to the operating speed of the ADC, causing oscillations that are hard to predict and control and/or substantial area usage due to the use of large capacitors.

SUMMARY

The disclosed systems (and methods) provide an improved concept for analog-digital conversion and generation of reference voltages for ADCs in particular allowing for high-speed, low-power and low-area reference voltage generation.

A reference voltage generator according to the improved concept is configured to supply a first pair of reference potentials at a first terminal pair and a second pair of reference potentials at a second terminal pair to a switched capacitor array. Such switched capacitor array is part of an analog-digital converter working with successive approximations. The reference voltage generator comprises a first input and a second input to be coupled to an external voltage supply. Further, the reference voltage generator comprises a first charge reservoir with a first terminal and with a second terminal. The first charge reservoir is coupled between the first terminal pair of the reference voltage generator. The first terminal of the first charge reservoir is coupled to the first input via a first switch and the second terminal of the first charge reservoir is coupled to the second input via a second switch. The second terminal pair of the reference voltage generator is coupled to the first and to the second input.

For example, the first switch and the second switch of the first charge reservoir may be operated under control of a connected analog-digital converter. In particular, the analog-digital converter may be configured to close the first switch and the second switch during a sampling period of the conversion and to open the first and the second switch after the sampling period. For example, the first pair of reference potentials and the second pair of reference potentials may be used by the analog-digital converter for different purposes during the course of the analog-digital conversion. For example, the first pair of reference potentials may feature a short settling period with respect to perturbations on the reference potentials. Such perturbations can, for example, originate from the analog-digital converter due to switching operations within the switched capacitor array. For example, the second pair of reference potentials features a high accuracy of the values of the reference potentials throughout the conversion.

In some example implementations, the reference voltage generator may comprise a first charge pump coupled to the first terminal of the first charge reservoir via a first pump switch and a second charge pump coupled to the second terminal of the first charge reservoir via a second pump switch. Preferably, the first charge pump and the second charge pump are configured to recharge the first charge reservoir during a recharging period during which the first pump switch and the second pump switch are closed.

Such recharging may be advantageous if the first charge reservoir is decoupled from the external voltage supply via the first switch and the second switch during a period of the conversion. In such case the charge stored on the first charge reservoir may for example decrease during the conversion due to switching operations in the switched capacitor array. Then, the first charge pump and the second charge pump may recharge the first charge reservoir during the charging period.

An analog-digital converter according to the improved concept is configured for conversion of an input voltage, represented by a pair of input potentials, into a binary code using successive approximation. The analog-digital converter comprises a reference voltage generator supplying a first pair of reference potentials and a second pair of reference potentials. The analog-digital converter further comprises a switched capacitor array configured to receive the first and the second pair of reference potentials as well as a control unit coupled to the switched capacitor array and configured to switch capacitors of the switched capacitor array either to the first pair of reference potentials or to the second pair of reference potentials depending on a progress of the conversion. In particular, the control unit is configured to switch a contact of each capacitor of the switched capacitor array that is associated to a bit of the binary code either to a reference potential of the first pair of reference potentials or to a reference potential of the second pair of reference potentials depending on the progress of the conversion.

In some implementations of the analog-digital converter the switched capacitor array is implemented as a multi-section array comprising at least two sections. The conversion is performed by successively determining switching configurations of capacitors of the switched capacitor array section by section with respect to the sections.

The individual sections may for example contain certain subsets of capacitors comprised by the switched capacitor array. For example the sections may be physically separated by electronic components that are not necessarily associated to a bit of the binary code such as capacitors or resistors or other electronic components. In other implementations, there may be no distinctive or no physical separation of the sections. In such an implementation the sections may for example be defined functionally or they may be defined via the properties of capacitors or other components comprised by the sections. For example the capacitance of capacitors comprised by the sections or a scaling of capacitances or an effective weight of capacitors may define the sections. Also combinations of the mentioned possibilities may be used, for example a scaling of capacitances plus a physical separation by electronic components.

In further example implementations of the analog-digital converter the control unit is configured to switch capacitors of a current section of the sections from the first pair of reference potentials to the second pair of reference potentials after all switching configurations of capacitors of the current section have been determined and before switching configurations of capacitors of a section of the sections adjacent to the current section are determined.

Herein the current section represents a section with respective capacitors whose switching configurations have just been determined at a given time. The section adjacent to the current section represents the section in which the switching configurations of all capacitors are not determined yet but will be determined next at the given time.

For example, the control unit may be comprised by a successive approximate register of the analog-digital converter. Preferably the sections are coupled in series within the switched capacitor array. The switching configurations of capacitors of the switched capacitor array may, for example, correspond to bit sequences of the binary code. In particular one of the reference potentials of the first pair of reference potentials and one of the reference potentials of the second pair of reference potentials may correspond to the binary 1 value while the remaining reference potentials of the first and the second pair of reference potentials may correspond to the binary 0 value.

A reference voltage generator according to the improved concept and/or an analog-digital converter according to the improved concept may also be represented by a circuit description. Such circuit description may, for example, be stored on a memory device and used in a design tool, in particular in an electronic design automation tool.

According to the improved concept, also a method for analog-digital conversion using successive approximation can be provided. In such conversion, an input voltage represented by a pair of input potentials is converted into a binary code. Herein the method comprises supplying a first pair of reference potentials and a second pair of reference potentials to a switched capacitor array of an analog-digital converter. The method further comprises switching capacitors of the switched capacitor array either to the first pair of reference potentials or to the second pair of reference potentials depending on a progress of the conversion.

A method according to the improved concept of analog-digital conversion may, for example, be comprised by a computer program product, in particular may be comprised by a code comprised by a computer program product.

Further embodiments or implementations of the method are readily derived from the various implementations and embodiments of the reference voltage generator and the analog-digital converter, respectively. Further embodiments or implementations of the analog-converter are readily derived from the various implementations and embodiments of the reference voltage generator.

BRIEF DESCRIPTION OF THE DRAWINGS

In the following the systems and methods are explained in detail with the aid of exemplary embodiments by reference to the drawings. Components that are functionally identical or have an identical effect are denoted by identical references. Identical or effectively identical components may be described only with respect to the figure where they occur first, their description is not necessarily repeated in successive figures.

DETAILED DESCRIPTION

Figure 1:
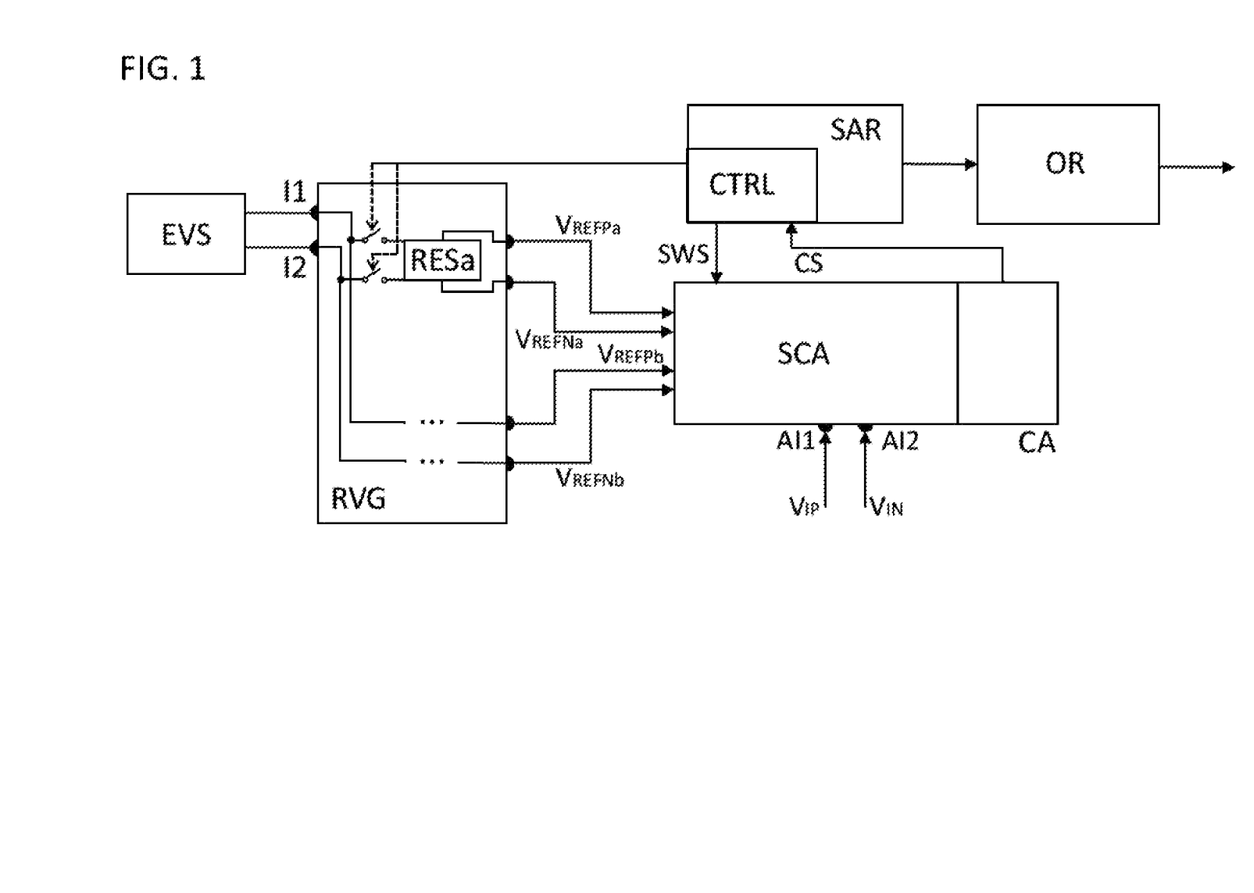
FIG. 1 shows an exemplary embodiment of an analog-digital converter working with successive approximation.

FIG. 1 shows an exemplary embodiment of an SAR-ADC according to the improved concept. A reference voltage generator RVG is coupled to an external voltage supply EVS via a first input I1 and a second input I2. The reference voltage generator RVG provides a first pair of reference potentials, $V_{REFPa}$ and $V_{REFNa}$, and a second pair of reference potentials, $V_{REFPb}$ and $V_{REFNb}$, to a switched capacitor array SCA of a comparing arrangement CA at a first terminal pair and a second terminal pair, respectively. A first charge reservoir RESa is coupled between the first pair of reference potentials. A first terminal of the first charge reservoir RESa is coupled to the first input I1 via a first switch and a second terminal of the first charge reservoir RESa is coupled to the second input I2 via a second switch. The second terminal pair is coupled to the first input I1 and to the second input I2.

The comparing arrangement CA determines if an analog voltage signal corresponding to a currently tested binary code provided by a control unit CTRL to the switched capacitor array SCA the via a switch signal SWS is above or below an input voltage. The input voltage is given by a sampled pair of input potentials, $V_{IP}$ and $V_{IN}$ supplied at a first analog input AI1 and a second analog input AI2. The control unit CTRL is in the shown embodiment comprised by the successive approximation register SAR. However, the control unit CTRL can also be an individual component or part of another circuit component. Depending on the determination the comparing arrangement CA provides a comparator signal CS to the control unit CTRL. The control unit CTRL adjusts a binary code to be tested by means of adjusting the switch signal SWS for example N times depending on the successive outcomes of the comparing arrangement CA, i.e. on the comparator signal CS. Herein N is a number of bits of the ADC, in particular N represents a length of the binary code. The adjusting of the switch signal SWS determines switching configurations of capacitors within the switched capacitor array SCA. Consequently, the analog voltage signal converges to the input voltage as close as possible. The binary code obtained at the end of this process is for example provided to an output register OR.

In some example implementations, the switch signal SWS may be adjusted for example more than N times, for example in implementations wherein redundancy is used as described later. The switch signal SWS does not necessarily represent one single signal, but may for example comprise several individual sub-signals. In particular its transfer may be implemented via a bus.

The supply of the first and the second pair of reference potentials results from a divide and conquer approach to the desire of providing reference potentials that comply with the following two requirements of i) very fast settling, in order not to compromise ADC speed, and
ii) low errors (i.e. small deviations with respect to the ideal value), in order not to compromise the ADC output accuracy.

The analog voltage signal must settle with enough accuracy in each of the for example N cycles, so that the comparator signal CS provides the correct indication. In high-speed SAR-ADCs the time available for the settling may be for example in the range of few hundreds picoseconds, for example in the range of 150 ps-400 ps. In high-speed SAR-ADCs, a time constant associated to the settling of the reference voltages must for example be as low as a few tens of picoseconds.

Figure 5:
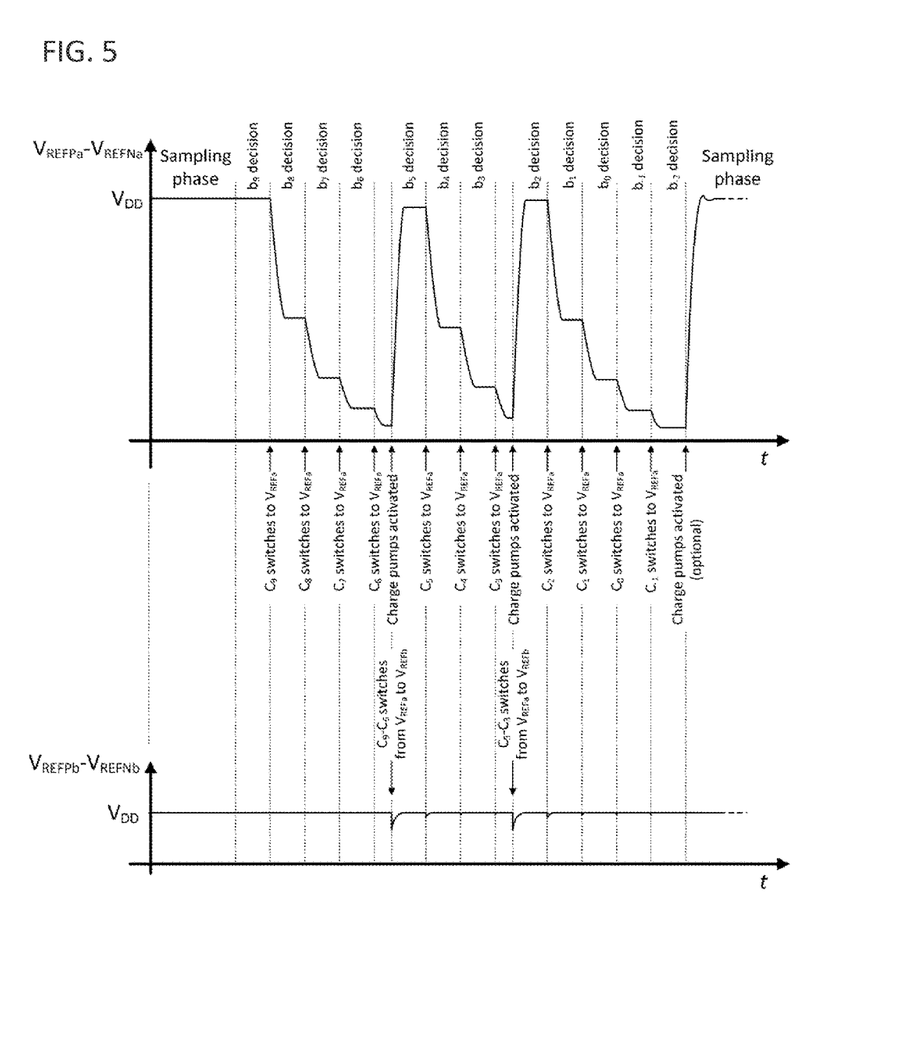
FIG. 5 shows a diagram of reference potentials utilized by an exemplary embodiment of an analog-digital converter as a function of time.
Figure 6:
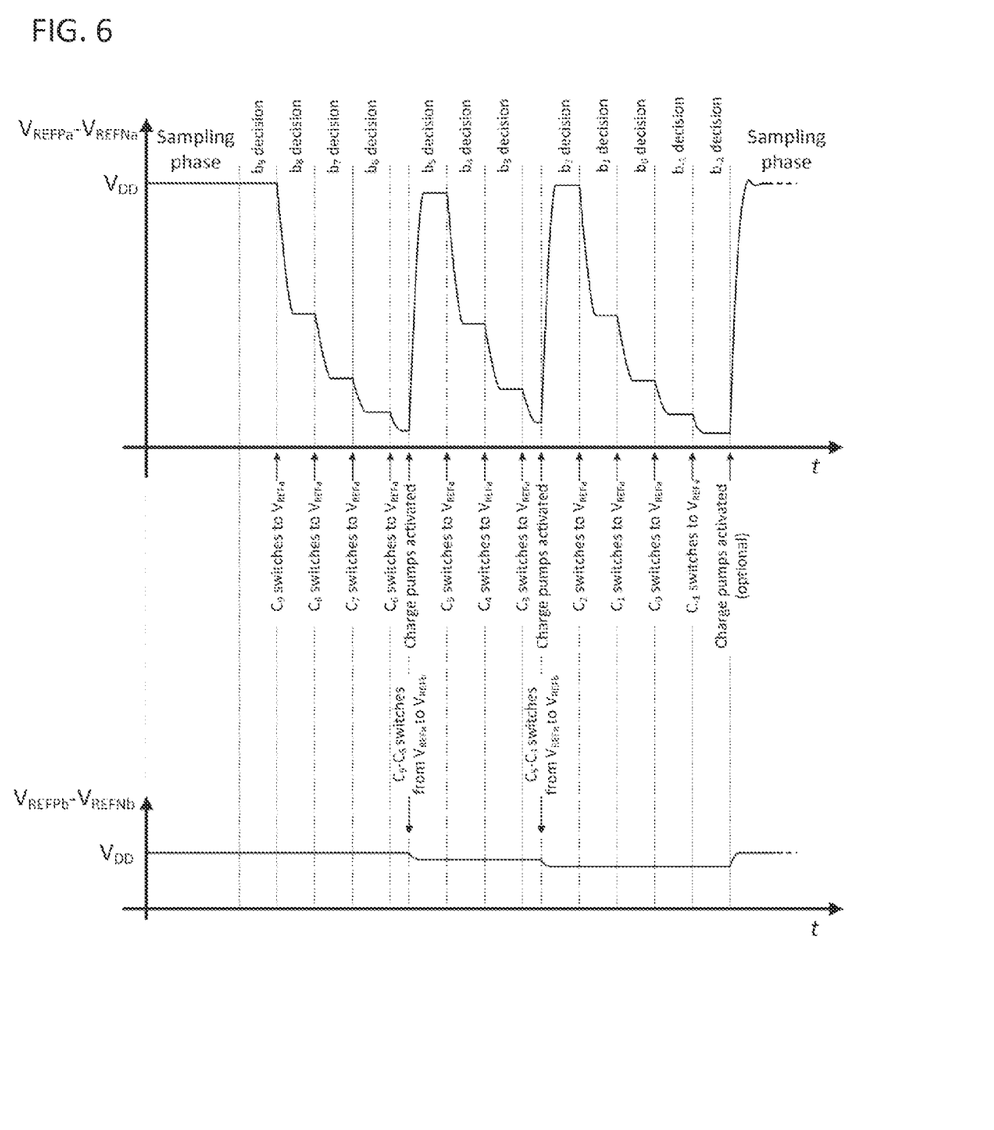
FIG. 6 shows a diagram of reference potentials utilized by a further exemplary embodiment of an analog-digital converter as a function of time.

The reference voltage generator RVG provides not one but two pairs of reference potentials. The first pair of reference potentials, $V_{REFPa}$ and $V_{REFNa}$, is generated in a way that ensures very fast settling, but may have errors. These errors may have no consequence for example when the SAR-ADC uses redundancy. The largest transients at the output of the comparing arrangement CA occur when capacitors are switched to this reference, for example as shown in FIG. 5 or FIG. 6. Therefore, in what concerns ADC speed limitations, this is one example of the relevant pair of reference potentials. The second pair of reference potentials, $V_{REFPb}$ and $V_{REFNb}$, exhibits low errors/disturbances. As will be described later, this results from switching capacitors of the comparing arrangement CA always first to the first pair of reference potentials before switching to the second pair of reference potentials. The latter is the critical pair of reference potentials in what concerns the ADC output accuracy, because at the end of the conversion all or almost all capacitors of the comparing arrangement CA will be connected to it. This means that the second pair of reference potentials sets the final output.

Figure 2:
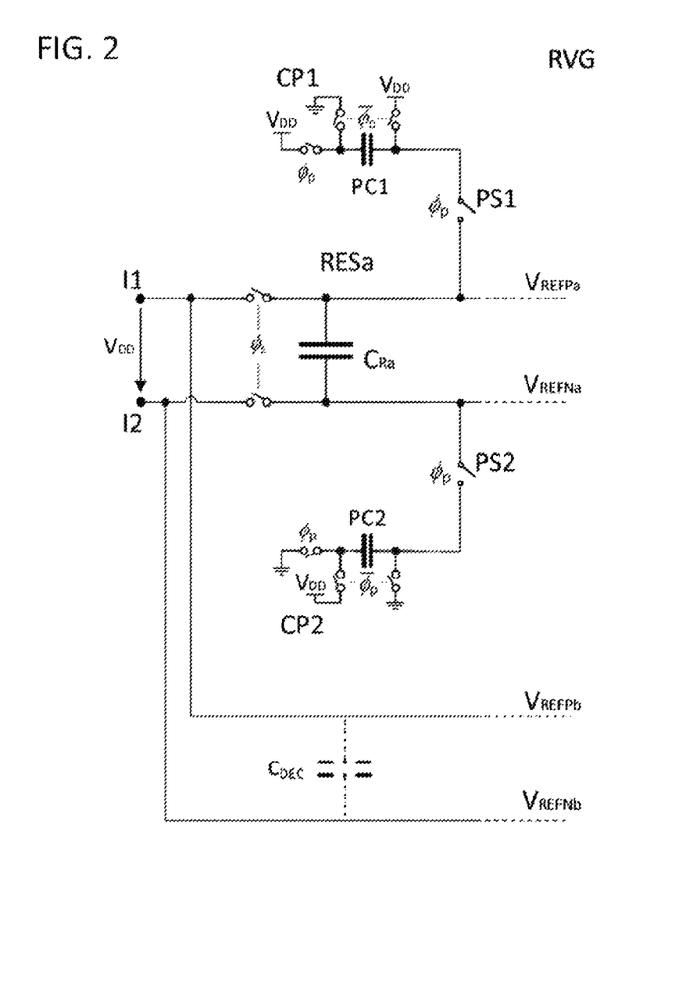
FIG. 2 shows an exemplary embodiment of a reference voltage generator.

FIG. 2 shows an exemplary embodiment of a reference voltage generator RVG for an SAR-ADC according to the improved concept. A fundamental building block of the reference voltage generator RVG is the first charge reservoir RESa. During a sampling phase, a sampling signal $\phi_S$ is provided for example by the control unit CTRL. The first charge reservoir RESa comprises a first capacitive element $C_{Ra}$ and two switches which close during a sampling phase of the ADC to sample an external voltage, $V_{DD}$, from the external voltage supply EVS to be connected at the first input I1 and the second input I2 on the first capacitive element $C_{Ra}$. This causes the difference between the first pair of reference potentials, $V_{REFPa}-V_{REFNa}$, to equal $V_{DD}$. After the sampling phase, the two switches are open, and the first capacitive element $C_{Ra}$ is floating and providing the first pair of reference potentials to the ADC.

This configuration allows the first pair of reference potentials supplied at the first terminal pair to settle rapidly during conversion, as the settling period is only limited by the resistance of the switches and of internal metal routing lines or the like. Furthermore, the settling behavior is not affected by poorly controlled variables, such as for example an inductance of bond wires for coupling to the external voltage source EVS or printed circuit board traces.

Such parasitics may affect transient during the sampling phase, but this is much less critical since:
i) the duration of the sampling phase is significantly longer than the time available for the first pair of reference potentials to settle in each decision cycle; and
ii) as discussed below, at the end of the conversion the reference voltage is not far from the ideal value $V_{DD}$ and only needs to be refreshed.

The reference voltage generator RVG also includes a first charge pump CP1 and a second charge pump CP2. These are configured to restore the first pair of reference potentials to near the initial values, for example $V_{DD}$ and 0, respectively, by recharging the first capacitive element $C_{Ra}$ during pump intervals of the conversion, as explained later in more detail. During a pump interval, a pump signal $\phi_P$ is provided for example by the control unit CTRL and causes the switches comprised by the first charge pump CP1 and the second charge pump CP2 to open or close, respectively. A first pump capacitor PC1 comprised by the first charge pump CP1 and a second pump capacitor PC2 comprised by the second charge pump CP2 are for example charged outside of the pump intervals and discharged to the first capacitive element $C_{Ra}$ during the pump intervals.

The second terminal pair supplying the second pair of reference potentials is connected to the first input I1 and the second input I2. The shown reference voltage generator RVG also comprises an optional internal decoupling capacitor $C_{DEC}$ that may for example help minimizing the disturbances suffered by the third and the fourth reference potential.

Figure 3:
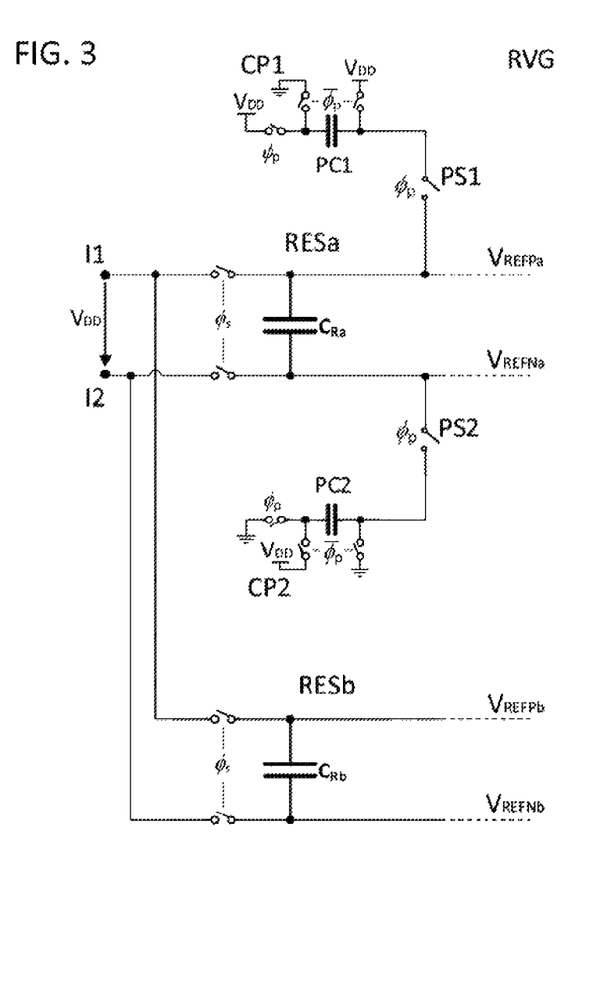
FIG. 3 shows a further exemplary embodiment of a reference voltage generator.

FIG. 3 shows a further exemplary embodiment of the reference voltage generator RVG which is based on the embodiment of FIG. 2. Here, the second pair of reference potentials, $V_{REFPb}$ and $V_{REFNb}$, is provided by a second charge reservoir RESb. Analog to the first charge reservoir RESa the second charge reservoir RESb comprises a second capacitive element $C_{Rb}$ and two switches which close during a sampling phase of the ADC to sample an external voltage, $V_{DD}$. This causes the difference between the first pair of reference potentials, $V_{REFPb}-V_{REFNb}$, to equal $V_{DD}$.

Figure 4:
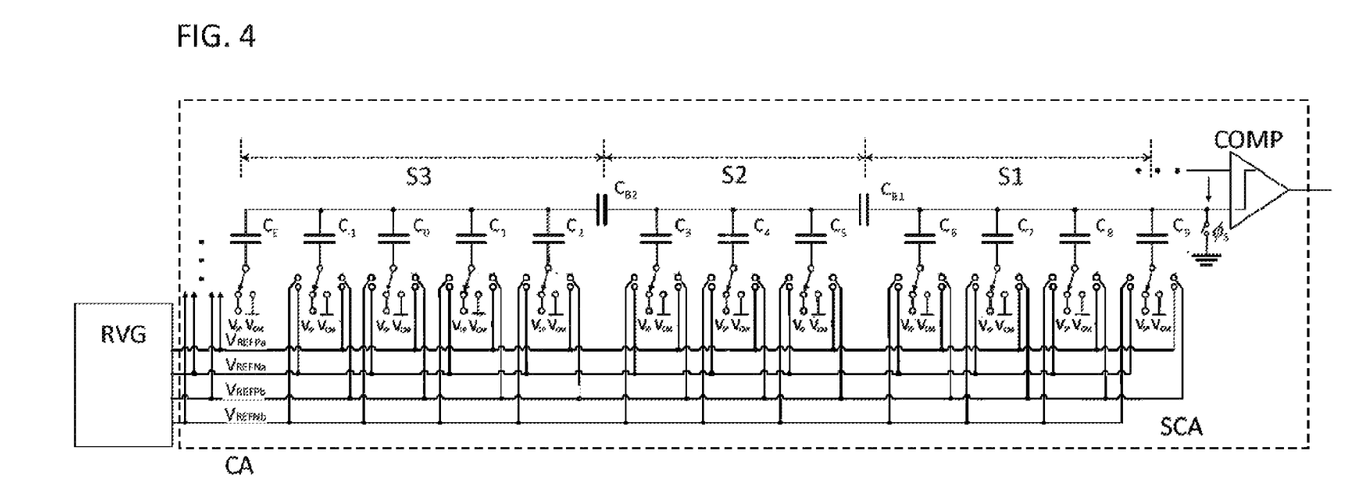
FIG. 4 shows an exemplary embodiment of a comparing arrangement with a switched capacitor array of an analog-digital converter.

FIG. 4 shows an exemplary embodiment of a comparing arrangement CA with a switched capacitor array SCA according to the improved concept and an attached reference voltage generator RVG for an example of a 10 bit (N=10) ADC.

The comparing arrangement CA is implemented by the switched capacitor array SCA and a comparator COMP. The switched capacitor array SCA is for example composed by a set of ten binary weighted or approximately binary weighted or effectively binary weighted or effectively approximately binary weighted or effectively sub-binary weighted positive bit capacitors $C_0, C_1, \ldots, C_9$, ten negative bit capacitors (not shown) with the same capacitances as the positive bit capacitors $C_0, C_1, \ldots, C_9$ and switches, preferably metal oxide semiconductor switches. Furthermore, the switched capacitor array SCA comprises in the presented case two positive bridge capacitors $C_{B1}, C_{B2}$, two negative bridge capacitors (not shown), a positive redundancy capacitor $C_{-1}$ and a negative redundancy capacitor (not shown). The positive redundancy capacitor $C_{-1}$ and the negative redundancy capacitor in a certain sense increase the resolution of the ADC. This may for example be used to implement redundancy utilizing an appropriate method. In particular the positive redundancy capacitor $C_{-1}$ and the negative redundancy capacitor may be used to limit errors made when the least significant bits are determined.

Furthermore, the switched capacitor array SCA comprises a positive equalizing capacitor $C_E$ and a negative equalizing capacitor (not shown). These are optional and in particular are not necessary for an ADC according to the improved concept. The positive equalizing capacitor $C_E$ and the negative equalizing capacitor may for example be utilized to adjust a charge distribution on the positive bit capacitors $C_0, C_1, \ldots, C_9$ and the negative bit capacitors, respectively.

The positive bit capacitors $C_0, C_1, \ldots, C_9$ are arranged in three sections S1, S2, S3. The respective upper contacts of the positive bit capacitors $C_0, C_1, \ldots, C_9$ are coupled to each other. Thereby the upper contacts of those comprised by the same of the sections S1, S2, S3 are directly connected and the upper contacts of positive bit capacitors $C_0, C_1, \ldots, C_9$ comprised by adjacent sections S1, S2, S3 are coupled via one of the positive bridge capacitors $C_{B1}, C_{B2}$. Furthermore the upper contacts of the positive bit capacitors $C_0, C_1, \ldots, C_9$ are coupled to a first comparator input of the comparator COMP. Analogously the respective upper contacts of the negative bit capacitors are coupled to each other. Thereby the upper contacts of those comprised by the same of the sections S1, S2, S3 are directly connected and the upper contacts of negative bit capacitors comprised by adjacent sections S1, S2, S3 are coupled via one of the negative bridge capacitors. Furthermore the upper contacts of the negative bit capacitors are coupled to a second comparator input of the comparator COMP. Details of the negative half are not shown, but it works in a complementary fashion to the positive half.

For example, the positive redundancy capacitor $C_{-1}$ and the positive bit capacitors $C_0, C_1, \ldots, C_9$ have capacitances that are multiples or are approximately multiples of a unit capacitance, C. For example with respect to FIG. 4, starting from the left with the positive redundancy capacitor ($C_{-1}$) and ending with the ninth positive bit capacitor $C_9$ the capacitances are C, 2C, 4C, 8C; C, 2C, 4C; C, 2C, 4C, 8C. The positive equalizing capacitor $C_E$ has for example a capacitance of C in the present implementation. However, other choices are as well possible and may be preferable in specific cases. For example the negative redundancy capacitors, the negative bit capacitors and the negative equalizing capacitor may have the same capacitances as their positive counterparts, respectively. According to the exact choice of the capacitances, an algorithm for evaluating the comparator signal CS and to obtain the binary code has to be adapted.

In a sampling phase of operation the first input potential $V_{IP}$, is sampled on the positive bit capacitors $C_0, C_1, \ldots, C_9$, the positive redundancy capacitor $C_{-1}$ and the positive equalizing capacitor $C_E$, and the second input potential $V_{IN}$ is sampled on the negative bit capacitors, the negative redundancy capacitor and the negative equalizing capacitor when the sampling signal $\phi_S$ triggers closure of the respective switches. In the same course, the first comparator input is connected to a fixed potential represented as a ground contact in FIG. 4 and the second comparator input is connected to the fixed potential represented as a further ground contact in FIG. 4.

The fixed potential may, for example, have a value between 0 and $V_{DD}$. The first and the second comparator input are disconnected from the fixed potential and the positive bit capacitors $C_0, C_1, \ldots, C_9$, the positive redundancy capacitor $C_{-1}$, the negative bit capacitors and the negative redundancy capacitor are switched to an intermediate potential $V_{CM}$. The switching to the intermediate potential $V_{CM}$ may, for example, be triggered by a signal comprised by the switch signal SWS. Consequently, a differential input voltage of the comparator becomes $V_{IP} - V_{IN}$ (an attenuation caused for example by parasitic capacitances at the first and the second comparator input is being ignored herein, since such effects are not relevant for the described operation). The intermediate potential $V_{CM}$ may for example be near $(V_{REFPa} + V_{REFNa})/2$, but its accuracy is not critical.

The comparator signal CS is generated at an output of the comparator COMP and provided to the control unit CTRL. This corresponds to the determination of one bit of the binary code, for example, of the most significant bit in the case the determination is performed for the first time in the current conversion. The control unit CTRL then adjusts the switch signal SWS according to the comparator signal CS. Depending on the switch signal SWS one of the positive bit capacitors $C_0, C_1, \ldots, C_9$ is switched to either $V_{REFPa}$ or $V_{REFNa}$, and the respective negative bit capacitor in the negative half is switched to the other alternative of $V_{REFPa}$ or $V_{REFNa}$. Then, after the potentials at the first and the second comparator input have settled, the comparator signal CS is again generated at the output of the comparator COMP and provided again to the control unit CTRL. This corresponds to the determination of the next bit in the row of the binary code. The control unit CTRL then adjusts the switch signal SWS again according to the comparator signal CS. Depending on the switch signal SWS the next in the row of the positive bit capacitors $C_0, C_1, \ldots, C_9$ is switched to either $V_{REFPa}$ or $V_{REFNa}$, and the respective negative bit capacitor in the negative half is switched to the other alternative of $V_{REFPa}$ or $V_{REFNa}$. The rest of the conversion is performed in the analog way.

In other implementations the described sampling of the first input potential $V_{IP}$ and of the second input potential $V_{IN}$ may be performed in an alternative manner. For example, the first input potential $V_{IP}$ may only be sampled on some of the positive bit capacitors $C_0, C_1, \ldots, C_9$ and on the positive redundancy capacitor $C_{-1}$ during the sampling phase. Analogously the second input potential $V_{IN}$ may only be sampled on some of the negative bit capacitors and on the negative redundancy capacitor during the sampling phase.

Alternatively, or in addition, there may for example be one or more extra capacitors in one or in more than one of the sections S1, S2, S3 that sample the first input potential $V_{IP}$ and the second input potential $V_{IN}$, respectively. The extra capacitors may for example be not involved in a part of the conversion process, in particular may not be switched to either $V_{REFPa}$ or $V_{REFNa}$ as described for the present implementation. Also alternative ways of performing the sampling of the first input potential $V_{IP}$ and the second input potential $V_{IN}$, respectively, may be suitable.

One example advantage of the presented implementation is that the amount of charge drawn from the references is smaller and much less input signal dependent than in other known implementations of circuits without connection to the intermediate potential. This is due to the fact that in the presented implementation all switched capacitors are initially connected to the intermediate potential $V_{CM}$, and then switched definitively to either $V_{REFPa}$ or $V_{REFNa}$ after the associated bit has been decided. Furthermore, after each comparator decision there is always one capacitor switching to $V_{REFPa}$ and another (of equal value, from the other half) switching to $V_{REFNa}$.

Another feature of the implementation depicted in FIG. 4 is that it avoids the exponential increase of the number of positive bit capacitors $C_0, C_1, \ldots, C_9$ and negative bit capacitors with resolution, which occurs in other ADC circuits. This is accomplished by using capacitive dividers, implemented by the positive bridge capacitors $C_{B1}, C_{B2}$, the negative bridge capacitors (not show) and the capacitors comprised by the third section S3. For example, the positive bridge capacitors $C_{B1}, C_{B2}$ and the negative bridge capacitors can be sized such that switching, for example, the fifth positive bit capacitor $C_5$ and the zeroth positive bit capacitor $C_0$ has an effect on the potential at the first comparator input being equivalent to switching two capacitors directly connected to the first input of the comparator and having capacitances of C/2 and C/64. Such adjustment may be denoted as effective scaling of capacitors. In other words, this means that the positive bridge capacitors $C_{B1}$, $C_{B2}$ and the negative bridge capacitors are used to adjust the effective weight of the positive bit capacitors $C_0, C_1, \ldots, C_9$ and the negative bit capacitors with respect to their effect on the first and the second comparator input, respectively.

The largest disturbances in the reference potentials happen when the capacitors associated to the most significant bits, MSBs, switch (because those are the larger ones in the array). The fact that reference disturbances and settling errors are lower when deciding the least significant bits, LSBs, motivates the usage of redundancy which for example eases the settling requirements during the decisions of the MSBs.

Redundancy can, for example, be implemented by scaling the positive bit capacitors $C_0, C_1, \ldots, C_9$ and the negative bit capacitors by a factor slightly lower than two, that is in a sub-binary way. In an alternative implementation of redundancy, the positive bit capacitors $C_0, C_1, \ldots, C_9$ and the negative bit capacitors are binary scaled and compensation capacitors are comprised by all or some of the sections. The compensation capacitors may then for example be switched to the first and/or the second pair of reference potentials during the conversion process to recover from errors made in previous switchings of positive and negative bit capacitors. In such implementations the positive and negative bridge capacitors may not be obligatory.

Yet another example for an implementation of redundancy is to scale the positive bit capacitors and the negative bit capacitors comprised by a given section in a binary way and to adjust the weight of positive bit capacitors and the negative bit capacitors comprised by different sections such that a recovery from wrong decisions becomes possible. This may for example be achieved by choosing the capacitances of the positive and the negative bit capacitors. Alternatively an effective sub-binary scaling of the positive and the negative bit capacitors may for example be achieved by choosing the capacitance of the positive and negative bridge capacitors $C_{B1}$, $C_{B2}$ accordingly.

Considering that, due to settling errors, the comparator takes a wrong decision and the MSB capacitor is finally switched to the wrong reference potential (e.g. to $V_{REFPa}$ instead of $V_{REFNa}$). Since the total capacitance still to be switched is larger than that of the MSB capacitor (for example due to sub-binary scaling, effective sub-binary scaling, existence of compensation capacitors or other suitable measures), it is possible to recover from that wrong decision. As mentioned above there are alternative ways of implementing redundancy. Nonetheless they commonly have the following in common:

i) In an N-bit SAR-ADC the comparing arrangement must contain more capacitors than the N positive bit capacitors and the N negative bit capacitors, for example one, two, or more than two positive redundancy capacitors or compensation capacitors and accordingly one, two, or more than two negative redundancy capacitors or compensation capacitors. Consequently, the comparator needs to perform more than N decisions;

ii) The calculation of the binary code is more complicated as the N-bit output word must be derived from the more than N comparator decisions; also, in solutions with redundancy where capacitors do not scale by a factor of 2 the calculations may be more complicated. In this case the output register OR may for example be more complex as it for example performs calculations.

As described above the positive bridge capacitors $C_{B1}$, $C_{B2}$ and the negative bridge capacitors can be sized such that switching, for example, the fifth positive bit capacitor $C_5$ and the zeroth positive bit capacitor $C_0$ has an effect on the potential at the first comparator input being equivalent to switching two capacitors directly connected to the first input of the comparator and having capacitances of C/2 and C/64. However, alternatively, the positive bridge capacitors $C_{B1}$, $C_{B2}$ and the negative bridge capacitors can be made larger in order to implement redundancy. In this case the effective weight of the capacitors comprised by the second section S2 and the third section S3 with respect to their effect on the potentials at the first and the second comparator input is higher, allowing to recover from incorrect decisions made when determining the bits associated with the capacitors comprised by the first section S1. Likewise the effective weight of the capacitors comprised by the third section S3 with respect to their effect on the potentials at the first and the second comparator input is higher, allowing to recover from incorrect decisions made when determining the bits associated with capacitors comprised by the second section S2.

During conversion, charge is drawn from the first capacitive element $C_{Ra}$ every time capacitors are switched to one of the first pair of reference potentials, thus decreasing the difference between the first pair of reference potentials. This affects the result of the conversion, and if the charge drawn is strongly dependent on the input signal, represented by the pair of input potentials, the first capacitive element $C_{Ra}$ must be rather large in order to minimize this effect.

If the charge drawn is independent on the first pair of input potentials, then the first pair of reference potentials changes throughout the conversion always in the same way. In particular, the first pair of reference potentials found at the end of the conversion—after all capacitors have been switched—is invariably the same. In that case, the usage of redundancy allows accommodating a fair amount of reference potential change during conversion, which permits using a much smaller first capacitive element $C_{Ra}$. However, commonly the charge drawn from the first capacitive element $C_{Ra}$ by the switched capacitor array SCA shown in FIG. 4 is not perfectly signal independent. So, though redundancy can be used to accommodate reference potential changes, the reference potential values at the end of the conversion still varies with the input potentials.

FIG. 5 shows a diagram of reference potentials supplied by an embodiment of a reference voltage generator (see FIG. 2) as a function of time when used with an embodiment of the ADC.

Shown is the evolution of a first reference voltage, $V_{REFa} = V_{REFPa} - V_{REFNa}$, and of second reference voltage, $V_{REFb} = V_{REFPb} - V_{REFNb}$, throughout the conversion. At the beginning of the sampling phase the first capacitive element $C_{Ra}$ is charged to $V_{DD}$. The decision of the MSB, $b_9$, is made with all positive bit capacitors $C_0, C_1, \ldots, C_9$ and all negative bit capacitors connected to $V_{CM}$, and so none of the reference potentials is disturbed. After the MSB is determined, the ninth positive bit capacitor $C_9$ and the ninth negative bit capacitor are switched to $V_{REFPa}$ or $V_{REFNa}$, respectively, depending on the determined $b_9$. Therefore charge is removed from the first capacitive element $C_{Ra}$, decreasing $V_{REFa}$. The decision of the next to most significant bit, $b_8$, is then carried out, and after that the eighth positive bit capacitor $C_8$ and the eighth negative bit capacitor are switched to $V_{REFPa}$ or $V_{REFNa}$ respectively, depending on $b_8$, further decreasing $V_{REFa}$ This process continues until the sixth positive bit capacitor $C_6$ and the sixth negative bit capacitor are switched to $V_{REFPa}$ or $V_{REFNa}$ respectively, depending on $b_6$.

Before determining $b_5$, the positive bit capacitors $C_6, \ldots, C_9$ comprised by the first section S1 and the negative bit capacitors comprised by the first section S1 are all disconnected from $V_{REFPa}$ and $V_{REFNa}$ and correspondingly connected to $V_{REFPb}$ or $V_{REFNb}$, respectively. Since, before this switching, these capacitors are charged with either $V_{REFPa}$ that is near $V_{REFPb}(=V_{DD})$, or with $V_{REFNa}$ which is near $V_{REFNb}(=0)$, $V_{REFPb}$ and $V_{REFNb}$ suffer only minor disturbances due to this switching.

So in the decision of $b_5$ all capacitors corresponding to bits that are already determined receive the "correct" reference voltage, $V_{REFb}$. Redundancy may be necessary to ensure that the decisions of $b_8$, $b_7$ and $b_6$ that were made with a decreasing first reference voltage $V_{REFa}$ do not cause errors in the final conversion result.

The switching of the positive bit capacitors $C_9$, $C_4$, $C_5$ and the negative bit capacitors comprised by the second section S2 is performed similarly to what was has just been described: They successively switch to $V_{REFPa}$ or $V_{REFNa}$, respectively and, before deciding $b_2$, are all simultaneously correspondingly connected to $V_{REFPb}$ or $V_{REFNb}$. As before, when this happens the disturbances to $V_{REFPb}$ and $V_{REFNb}$ are small. Redundancy may be necessary to ensure that the decisions of $b_5$, $b_4$ and $b_3$ that were made with a decreasing first reference voltage $V_{REFa}$ do not cause errors in the final conversion result.

In the example being considered there are two time intervals where a set of capacitors is disconnected from $V_{REFPa}/V_{REFNa}$ and connected to $V_{REFPb}/V_{REFNb}$. In those intervals the first charge pump CP1 and the second charge pump CP2 are activated, refreshing $V_{REFPa}$–$V_{REFNa}$ to near $V_{DD}$. This avoids that $V_{REFa}$ keeps dropping throughout the conversion. Note there is a limit to how much $V_{REFa}$ drop can be sustained by using redundancy. This sets the size of the first capacitive element $C_{Ra}$. In the example shown in FIG. 5, the use of charge pumps decreases the drop of $V_{REFa}$ by roughly a factor of three, meaning that the first capacitive element $C_{Ra}$ can be chosen three times smaller than it would be possible without the use of charge pumps.

The first pump capacitor PC1 and the second pump capacitor PC2 can for example be dimensioned relatively small. For example if $V_{DD}=1V$ and $V_{REFa}$ is to be increased by dV=10 mV, capacitances (10 mV/1V)/2=1/200 times the capacitance of the first capacitive element $C_{Ra}$ are required. The first charge pump CP1 and the second charge pump CP2 may also be activated immediately before the first capacitive element $C_{Ra}$ is charged by the external voltage supply EVS. This may bring $V_{REFPa}$ nearer to $V_{DD}$ and $V_{REFNa}$ nearer to 0, thus easing the settling requirements.

To complete the conversion without introducing any errors, the decisions of the remaining bits would have to be done by connecting the corresponding capacitors to the "correct" reference voltages, $V_{REFPb}$ and $V_{REFNb}$ However this would disturb $V_{REFb}$ significantly and affect the potentials at the first and the second comparator input thus (mainly through the capacitors associated to the first section S1) impacting the ADC conversion result negatively.

Instead, the decisions of the remaining bits are performed by successively connecting the respective capacitors to $V_{REFPa}$ or $V_{REFNa}$. This means, the remaining bits are determined using a reference voltage, $V_{REFa}$, that is smaller than the ideal one, $V_{REFb}$. This may cause deviations in the code transition levels of the ADC, but they are low due to the relatively low effective weight of the remaining capacitors.

In alternative implementations additional charge pumps may be utilized. The additional charge pumps may for example be activated when capacitors are still being connected to $V_{REFPa}/V_{REFNa}$.

In alternative implementations, the time intervals where a set of capacitors is disconnected from $V_{REFPa}/V_{REFNa}$ and connected to $V_{REFPb}/V_{REFNb}$ may also differ from the time intervals described above. In particular, it is possible and may be suitable to disconnect some of the positive and negative bit capacitors associated to bits that are already determined from $V_{REFPa}$ and $V_{REFNa}$, respectively and correspondingly connect them to $V_{REFPb}$ or $V_{REFNb}$, respectively.

FIG. 6 shows a diagram of reference potentials supplied by another embodiment of a reference voltage generator RVG (see FIG. 3) as a function of time when used with an embodiment of the ADC.

In the presented embodiment of the reference voltage generator RVG, $V_{REFPb}$ and $V_{REFNb}$ are generated by a second charge reservoir RESb as described with respect to FIG. 3. The operation during conversion is the same as described with respect to FIG. 5 and the second capacitive element $C_{Rb}$ also samples $V_{DD}$.

As shown in FIG. 6, there is no difference in $V_{REFa}$, but $V_{REFb}$ now decreases when the capacitors comprised by the first section S1 and the second section S2 are connected to $V_{REFPb}$ Or $V_{REFNb}$ The corresponding voltage drops are very small, in particular are much smaller than those observed in $V_{REFa}$, because the respective capacitors are already pre-charged to either $V_{REFPa}$ or $V_{REFNa}$ being near $V_{REFPb}$ and $V_{REFNb}$, respectively. Achieving similarly low voltage drops with a single charge reservoir only would require a capacitor much larger than the sum of the capacitances of the first capacitive element $C_{Ra}$ and the second capacitive element $C_{Rb}$.

No harm is caused by the variations of $V_{REFb}$ due to the use of redundancy. This alternative solution avoids direct switching to the external voltage supply EVS during conversion, which may cause oscillations. Furthermore, when several ADCs are used in a System-on-Chip and share the same pads or pins for connection to the external voltage supply EVS it may be preferable to use this alternative to avoid cross-talk between the ADCs.

Within this document, the notation "upper contact", used for example with respect to upper contacts of the positive and negative bit capacitors and the positive and negative redundancy capacitors for example in the description of FIG. 4 and in the following claim set, specifies respective contacts that are interconnected in the described way. In particular "upper" has no geometrical, spatial or orientation related meaning in these notations.

What is claimed is:

1. Reference voltage generator (RVG) for supplying a first pair of reference potentials at a first terminal pair and a second pair of reference potentials at a second terminal pair to a switched capacitor array (SCA) of an analog-digital converter working with successive approximation, wherein
the reference voltage generator (RVG) comprises a first input (I1) and a second input (I2) to be coupled to an external voltage supply (EVS);
a first charge reservoir (RESa) with a first and a second terminal coupled between the first terminal pair, the first terminal coupled to the first input (I1) via a first switch and the second terminal coupled to the second input (I2) via a second switch;

a first charge pump (CP1) coupled to the first terminal of the first charge reservoir (RESa) via a first pump switch (PS1); and a second charge pump (CP2) coupled to the second terminal of the first charge reservoir (RESa) via a second pump switch (PS2), the second terminal pair coupled to the first input (I1) and the second input (I2).

2. Reference voltage generator (RVG) according to claim 1, wherein the first charge pump (CP1) and the second charge pump (CP2) are configured to recharge the first charge reservoir (RESa) during a recharging period during which the first pump switch (PS1) and the second pump switch (PS2) are closed.

3. Reference voltage generator (RVG) according to claim 1, wherein
a first supply potential is applied to the first input (I1), a second supply potential is applied to the second input (I2)
the first charge pump (CP1) comprises a first pump capacitor (PC1) with a first contact being switchably connected to the first supply potential and to the second supply potential and with a second contact being switchably connected to the first supply potential and to the first pump switch (PS1); and
the second charge pump (CP2) comprises a second pump capacitor (PC2) with a first contact being switchably connected to the first supply potential and to the second supply potential and with a second contact being switchably connected to the second supply potential and to the second pump switch (PS2).

4. Reference voltage generator (RVG) according to claim 1, further comprising a second charge reservoir (RESb) with a first terminal coupled to the first input (I1) via a third switch and a second terminal coupled to the second input (I2) via a fourth switch, the second charge reservoir (RESb) being coupled between the second terminal pair.

5. Analog-digital converter for conversion of an input voltage, represented by a pair of input potentials, into a binary code using successive approximation, the analog-digital converter comprising:
a reference voltage generator (RVG) supplying a first pair of reference potentials and a second pair of reference potentials;
a switched capacitor array (SCA) configured to receive the first and the second pair of reference potentials; and
a control unit (CTRL) coupled to the switched capacitor array (SCA) and configured to switch each capacitor of the switched capacitor array (SCA) either to the first pair of reference potentials or to the second pair of reference potentials depending on a progress of the conversion.

6. Analog-digital converter according to claim 5, wherein the switched capacitor array (SCA) is implemented as a multi-section array comprising at least two sections (S1, S2, S3), the conversion being performed by successively determining switching configurations of capacitors of the switched capacitor array (SCA) section by section with respect to the sections (S1, S2, S3).

7. Analog-digital converter according to claim 6, wherein the control unit (CTRL) is configured to, after all switching configurations of capacitors of a current section of the sections (S1, S2, S3) have been determined and before switching configurations of capacitors of a section of the sections (S1, S2, S3) adjacent to the current section are determined, switch capacitors of the current section from the first pair of reference potentials to the second pair of reference potentials.

8. Analog-digital converter according to claim 6, further comprising a comparing arrangement (CA) comprising the switched capacitor array (SCA) and a comparator (COMP); and wherein the switched capacitor array (SCA) comprises
a number of N, N being greater or equal to two and being the length of the binary code, positive bit capacitors ($C_0$, $C_1$, ..., $C_9$) with respective upper contacts coupled to each other and to a first comparator input of the comparator (COMP); and
the number of N negative bit capacitors with respective upper contacts coupled to each other and to a second comparator input of the comparator (COMP).

9. Analog-digital converter according to claim 8, wherein each of the sections (S1, S2, S3) comprises a respective number the positive bit capacitors ($C_0$, $C_1$, ..., $C_9$) and the same respective number of the negative bit capacitors.

10. Analog-digital converter according to claim 9, the switched capacitor array (SCA) further comprising at least one positive bridge capacitor ($C_{B1}$, $C_{B2}$) and at least one negative bridge capacitor, one of the at least one positive bridge capacitor ($C_{B1}$, $C_{B2}$) being coupled in between the positive bit capacitors ($C_0$, $C_1$, ..., $C_9$) and one of the at least one negative bridge capacitor being coupled between the negative bit capacitors of each pair of the sections (S1, S2, S3) adjacent to each other.

11. Analog-digital converter according to claim 10, wherein
in at least one of the sections (S1, S2, S3) the positive bit capacitors ($C_0$, $C_1$, ..., $C_9$) are binary weighted or approximately binary weighted among each other; and
in at least one of the sections (S1, S2, S3) the negative bit capacitors are binary weighted or approximately binary weighted among each other.

12. Analog-digital converter according to claim 10, wherein the positive bit capacitors ($C_0$, $C_1$, ..., $C_9$) are effectively binary weighted or effectively approximately binary weighted and the negative bit capacitors are effectively binary weighted or effectively approximately binary weighted with respect to their effect on the first and the second comparator input, respectively, due to the dimensioning of the positive bridge capacitors ($C_{B1}$, $C_{B2}$) and the negative bridge capacitors, respectively.

13. Analog-digital converter according to claim 10, wherein the capacitances of the positive bridge capacitors ($C_{B1}$, $C_{B2}$) and of the negative bridge capacitors are dimensioned such that the positive bit capacitors ($C_0$, $C_1$, ..., $C_9$) are effectively sub-binary weighted with respect to their effect on the first comparator input and the negative bit capacitors are effectively sub-binary weighted with respect to their effect on the second comparator input.

14. Analog-digital converter according to claim 5,
further comprising a comparing arrangement (CA) comprising the switched capacitor array (SCA) and a comparator (COMP); and wherein the switched capacitor array (SCA) comprises
a number of N, N being greater or equal to two and being the length of the binary code, positive bit capacitors ($C_0$, $C_1$, ..., $C_9$) with respective upper contacts coupled to each other and to a first comparator input of the comparator (COMP); and
the number of N negative bit capacitors with respective upper contacts coupled to each other and to a second comparator input of the comparator (COMP).

15. Analog-digital converter according to claim 14, wherein the positive bit capacitors ($C_0, C_1, \ldots, C_9$) are binary weighted or sub-binary weighted with respect to each other and the negative bit capacitors are binary weighted or sub-binary weighted with respect to each other.

16. Analog-digital converter according to claim 8, the switched capacitor array (SCA) further comprising:
a number R, R being greater or equal to one, of positive redundancy capacitors ($C_{-1}$) with respective upper contacts coupled to each other and to the upper contacts of the positive bit capacitors ($C_0, C_1, \ldots, C_9$); and
the number of R negative redundancy capacitors with respective upper contacts coupled to each other and to the upper contacts of the negative bit capacitors.

17. Analog-digital converter according to claim 5, wherein the reference voltage generator (RVG) is implemented as a reference voltage generator (RVG) according to one of claims 1 to 4.

18. Analog-digital converter according to claim 17, wherein the control unit (CTRL) is configured to operate the first and the second switch coupling the first and the second terminal of the first charge reservoir (RESa) to the first input (I1) and the second input (I2), respectively.

19. Analog-digital converter according to claim 5, wherein the control unit (CTRL) is further coupled to the reference voltage generator (RVG) and configured to control the supply of the first and the second pair of reference potentials.

20. Method for analog-digital conversion using successive approximation to convert an input voltage, represented by a pair of input potentials, into a binary code, wherein the method comprises:
supplying a first pair of reference potentials and a second pair of reference potentials to a switched capacitor array (SCA) of an analog-digital converter; and
switching each capacitor of the switched capacitor array (SCA) either to the first pair of reference potentials or to the second pair of reference potentials depending on a progress of the conversion.

21. Method according to claim 20, wherein the switched capacitor array (SCA) is implemented as a multi-section array comprising at least two sections (S1, S2, S3) and wherein the method further comprises successive determination of switching configurations of capacitors of the switched capacitor array (SCA) section by section with respect to the sections (S1, S2, S3).

22. Method according to claim 21, wherein during the conversion a current section of the sections (S1, S2, S3) is specified as comprising a switching configuration having been determined last and the method further comprises switching capacitors of the current section from the first pair of reference potentials to the second pair of reference potentials when all switching configurations of the capacitors of the current section have been determined and before switching configurations of capacitors of a subsequent section of the sections (S1, S2, S3) are determined, the subsequent section being adjacent to the current section.

23. Method according to claim 20, wherein the first pair of reference potentials is refreshed to previous values during a recharging period.

24. Method according to claim 23, wherein the recharging period coincides with the switching of capacitors of the switched capacitor array (SCA) from the first pair of reference potentials to the second pair of reference potentials depending on a progress of the conversion.

25. Method according to claim 20, wherein the method further comprises correcting errors during the conversion by means of a redundancy method.

26. Method according to claim 25, wherein the redundancy method comprises adjusting the first pair of reference potentials and/or the second pair of reference potentials in the course of the conversion.

27. Method according to claim 25, wherein the redundancy method comprises adjusting a weight or an effective weight of capacitors of the switched capacitor array (SCA).

28. Method according to claim 25, wherein the method further comprises determining switching configurations of redundancy capacitors associated with a number R, R being greater or equal to one, of redundancy bits.

29. Circuit description representing a reference voltage generator (RVG) the circuit description stored on a memory device and to be used in an Electronic Design Automation tool, the circuit description comprising:
a reference voltage generator (RVG) for supplying a first pair of reference potentials at a first terminal pair and a second pair of reference potentials at a second terminal pair to a switched capacitor array (SCA) of an analog-digital converter working with successive approximation, wherein
the reference voltage generator (RVG) comprises a first input GO and a second input (I2) to be coupled to an external voltage supply (EVS); and
a first charge reservoir (RESa) with a first and a second terminal coupled between the first terminal pair, the first terminal coupled to the first input (I1) via a first switch and the second terminal coupled to the second input (I2) via a second switch; and
the second terminal pair is coupled to the first input GO and the second input (I2).

30. Circuit description representing an analog-digital converter, the circuit description stored on a memory device and to be used in an Electronic Design Automation tool, the circuit description comprising:
a reference voltage generator (RVG) supplying a first pair of reference potentials and a second pair of reference potentials;
a switched capacitor array (SCA) configured to receive the first and the second pair of reference potentials;
a control unit (CTRL) coupled to the switched capacitor array (SCA) and configured to switch capacitors of the switched capacitor array (SCA) either to the first pair of reference potentials or to the second pair of reference potentials depending on a progress of the conversion.

31. A computer program product comprising a code, said code when executed by a processor causes the processor to:
supply a first pair of reference potentials and a second pair of reference potentials to a switched capacitor array (SCA) of an analog-digital converter; and
switch each capacitor of the switched capacitor array (SCA) either to the first pair of reference potentials or to the second pair of reference potentials depending on a progress of the conversion.

32. Reference voltage generator (RVG) for supplying a first pair of reference potentials at a first terminal pair and a second pair of reference potentials at a second terminal pair to a switched capacitor array (SCA) of an analog-digital converter working with successive approximation, wherein
the reference voltage generator (RVG) comprises a first input GO and a second input (I2) to be coupled to an external voltage supply (EVS);
a first charge reservoir (RESa) with a first and a second terminal coupled between the first terminal pair, the first terminal coupled to the first input (I1) via a first switch and the second terminal coupled to the second input (I2) via a second switch; and the second terminal pair is coupled to the first input (I1) and the second input (I2); and a decoupling capacitor (CDEC) is coupled between the second terminal pair.

33. Reference voltage generator (RVG) according to claim 32, further comprising a second charge reservoir (RESb) with a first terminal coupled to the first input (I1) via a third switch and a second terminal coupled to the second input (I2) via a fourth switch, the second charge reservoir (RESb) being coupled between the second terminal pair.

* * * * *

UNITED STATES PATENT AND TRADEMARK OFFICE
CERTIFICATE OF CORRECTION

PATENT NO. : 10,038,454 B2
APPLICATION NO. : 15/307793
DATED : July 31, 2018
INVENTOR(S) : Pedro Miguel Ferreira de Figueiredo et al.

Page 1 of 1

It is certified that error appears in the above-identified patent and that said Letters Patent is hereby corrected as shown below:

In the Claims

Column 13, Line 57, Claim 6, delete "at least two sections" and insert --at least two of sections--.

Column 15, Line 44, Claim 21, delete "at least two sections" and insert --at least two of sections--.

Column 16, Lines 25-26, Claim 29, delete "first input G0" and insert --first input (I1)--.

Column 16, Line 33, Claim 29, delete "first input G0" and insert --first input (I1)--.

Column 16, Lines 63-64, Claim 32, delete "first input G0" and insert --first input (I1)--.

Column 17, Line 6, Claim 32, delete "decoupling capacitor (CDEC)" and insert --decoupling capacitor ($C_{DEC}$)--.

Signed and Sealed this
First Day of January, 2019

Andrei Iancu
*Director of the United States Patent and Trademark Office*